(12) United States Patent   (10) Patent No.: US 8,947,362 B2
Kamii et al.                    (45) Date of Patent: Feb. 3, 2015

(54) KEY INPUT DEVICE AND MOBILE COMMUNICATION TERMINAL USING THE KEY INPUT DEVICE

(75) Inventors: Toshihiro Kamii, Daito (JP); Yasuhiro Miki, Daito (JP)

(73) Assignee: KYOCERA Corporation, Kyoto (JP)

( * ) Notice: Subject to any disclaimer, the term of this patent is extended or adjusted under 35 U.S.C. 154(b) by 770 days.

(21) Appl. No.: 13/131,248

(22) PCT Filed: Nov. 10, 2009

(86) PCT No.: PCT/JP2009/005977
§ 371 (c)(1),
(2), (4) Date: May 25, 2011

(87) PCT Pub. No.: WO2010/061543
PCT Pub. Date: Jun. 3, 2010

(65) Prior Publication Data
US 2011/0234499 A1    Sep. 29, 2011

(30) Foreign Application Priority Data

Nov. 26, 2008 (JP) ................................ 2008-301613
Nov. 26, 2008 (JP) ................................ 2008-301614

(51) Int. Cl.
*G06F 3/02* (2006.01)
*H03M 11/00* (2006.01)
*G06F 3/023* (2006.01)

(52) U.S. Cl.
CPC ............ *H03M 11/003* (2013.01); *G06F 3/023* (2013.01)
USPC ....................................................... 345/169

(58) Field of Classification Search
None
See application file for complete search history.

(56) References Cited

U.S. PATENT DOCUMENTS

| | | | |
|---|---|---|---|
| 3,792,466 A | * | 2/1974 | Arnold et al. .................. 341/25 |
| 4,548,697 A | | 10/1985 | Nidola et al. |
| 4,604,173 A | | 8/1986 | Nidola et al. |
| 4,922,248 A | | 5/1990 | Shiga |

(Continued)

FOREIGN PATENT DOCUMENTS

| | | |
|---|---|---|
| CN | 101046715 A | 10/2007 |
| JP | S59-157298 A | 9/1984 |

(Continued)

OTHER PUBLICATIONS

First Office Action dated Mar. 22, 2013, issued in counterpart Chinese application No. 200980147478.4.

(Continued)

*Primary Examiner* — Joseph Feild
*Assistant Examiner* — Parul Gupta
(74) *Attorney, Agent, or Firm* — Procopio, Cory, Hargreaves & Savitch, LLP

(57) ABSTRACT

First detection information related to electrical connection between each row signal line and each column signal line is received from a key matrix circuit (S101). Based on the first detection information, it is determined whether a possibility exists that a user has pressed at least three key switches simultaneously and electrical connection between signal lines for a key switch that has not been pressed has been erroneously detected (S108). Information in accordance with key switches pressed by the user is output based on the first detection information when the determination is negative (S109), whereas output of information based on the first detection information is blocked when the determination is positive.

11 Claims, 18 Drawing Sheets

(56) References Cited

U.S. PATENT DOCUMENTS

| | | | |
|---|---|---|---|
| 7,391,861 B2 * | 6/2008 | Levy | 379/368 |
| 2007/0287494 A1 | 12/2007 | You et al. | |
| 2009/0215500 A1 | 8/2009 | You et al. | |

FOREIGN PATENT DOCUMENTS

| JP | S61-032127 A | 2/1986 |
|---|---|---|
| JP | S61-055725 A | 3/1986 |
| JP | H03-003023 A | 1/1991 |
| JP | H05-11326 B2 | 2/1993 |
| JP | H05-189116 A | 7/1993 |
| JP | 3084018 U | 2/2002 |
| KR | 2008-0026261 A | 3/2008 |

OTHER PUBLICATIONS

Notice of Grounds for Rejection dated Jan. 17, 2013, issued in counterpart Korean application No. 2011-7014455.

International Search Report dated Feb. 23, 2010 issued by the Japanese Patent Office for International Application No. PCT/JP2009/005977.

Notification of Reason for Refusal dated Oct. 23, 2012, issued in counterpart Japanese Application No. 2008-301613.

* cited by examiner

FIG. 3

| | Key sense 0 | Key sense 1 | Key sense 2 | Key sense 3 |
|---|---|---|---|---|
| Key scan 0 | 1 | 2 | 3 | 0 |
| Key scan 1 | 4 | 5 | 6 | 9 |
| Key scan 2 | 7 | 8 | OK | ✕ |
| Key scan 3 | Talk | ✕ | → | ← |
| Key scan 4 | ✕ | ✕ | ↓ | ↑ |

FIG. 5A

|  | Key sense 0 | Key sense 1 | Key sense 2 | Key sense 3 |
|---|---|---|---|---|
| Key scan 0 | ①  | ②  | 3 | 0 |
| Key scan 1 | ④  | 5 | 6 | 9 |
| Key scan 2 | 7 | 8 | OK | ✕ |
| Key scan 3 | Talk | ✕ | ↓ | ↑ |
| Key scan 4 | ✕ | ✕ | ← | → |

FIG. 5B

|  | Key sense 0 | Key sense 1 | Key sense 2 | Key sense 3 |
|---|---|---|---|---|
| Key scan 0 | 1 | 1 | 0 | 0 |
| Key scan 1 | 1 | 1 | 0 | 0 |
| Key scan 2 | 0 | 0 | 0 | 0 |
| Key scan 3 | 0 | 0 | 0 | 0 |
| Key scan 4 | 0 | 0 | 0 | 0 |

|  | Key sense 0 | Key sense 1 | Key sense 2 | Key sense 3 |
|---|---|---|---|---|
| Key scan 0 | 1 | 2 | 3 | 0 |
| Key scan 1 | 4 | 5 | 6 | 9 |
| Key scan 2 | 7 | 8 | OK | ✕ |
| Key scan 3 | Talk | ✕ | ↓ | ↑ |
| Key scan 4 | ✕ | ✕ | ← | → |

|  | Key sense 0 | Key sense 1 | Key sense 2 | Key sense 3 |
|---|---|---|---|---|
| Key scan 0 | a1 | b1 | c1 | d1 |
| Key scan 1 | a2 | b2 | c2 | d2 |
| Key scan 2 | a3 | b3 | c3 | 0 |
| Key scan 3 | a4 | 0 | c4 | d4 |
| Key scan 4 | 0 | 0 | c5 | d5 |

|  | Key sense 0 | Key sense 1 | Key sense 2 | Key sense 3 |
|---|---|---|---|---|
| Key scan 0 | ①  | ②  | 3 | 0 |
| Key scan 1 | ④  | 5 | 6 | 9 |
| Key scan 2 | 7 | 8 | OK | ✕ |
| Key scan 3 | Talk | ✕ | ↓ | ↑ |
| Key scan 4 | ✕ | ✕ | ← | → |

|  | Key sense 0 | Key sense 1 | Key sense 2 | Key sense 3 |
|---|---|---|---|---|
| Key scan 0 | 1 | 1 | 0 | 0 |
| Key scan 1 | 1 | 1 | 0 | 0 |
| Key scan 2 | 0 | 0 | 0 | 0 |
| Key scan 3 | 0 | 0 | 0 | 0 |
| Key scan 4 | 0 | 0 | 0 | 0 |

|  | Key sense 0 | Key sense 1 | Key sense 2 | Key sense 3 |
|---|---|---|---|---|
| Key scan 0 | ①  | ②  | 3 | 0 |
| Key scan 1 | 4 | 5 | ⑥ | 9 |
| Key scan 2 | 7 | 8 | OK | ✕ |
| Key scan 3 | (Talk) | ✕ | ↓ | ↑ |
| Key scan 4 | ✕ | ✕ | ← | → |

|  | Key sense 0 | Key sense 1 | Key sense 2 | Key sense 3 |
|---|---|---|---|---|
| Key scan 0 | 1 | 1 | 0 | 0 |
| Key scan 1 | 0 | 0 | 1 | 0 |
| Key scan 2 | 0 | 0 | 0 | 0 |
| Key scan 3 | 1 | (1) | 0 | 0 |
| Key scan 4 | 0 | 0 | 0 | 0 |

|  | Key sense 0 | Key sense 1 | Key sense 2 | Key sense 3 |
|---|---|---|---|---|
| Key scan 0 | 1 | 1 | 0 | 0 |
| Key scan 1 | 0 | 0 | 1 | 0 |
| Key scan 2 | 0 | 0 | 0 | 0 |
| Key scan 3 | 1 | (0) | 0 | 0 |
| Key scan 4 | 0 | 0 | 0 | 0 |

FIG. 12A

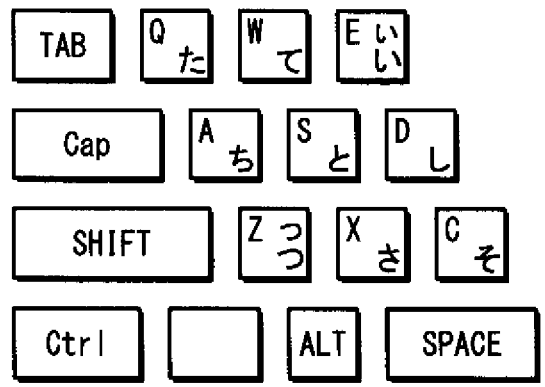

FIG. 12B

|  | Key sense 0 | Key sense 1 | Key sense 2 | Key sense 3 |
|---|---|---|---|---|
| Key scan 0 | TAB | た(TA) | て(TE) | い(I) |
| Key scan 1 | Cap | ち(CHI) | と(TO) | し(SHI) |
| Key scan 2 | SHIFT | つ(TSU) | さ(SA) | そ(SO) |
| Key scan 3 | Ctrl | ✕ | ALT | SPACE |

FIG. 12C

|  | Key sense 0 | Key sense 1 | Key sense 2 | Key sense 3 |
|---|---|---|---|---|
| Key scan 0 | TAB | ~~た(TA)~~ | ~~て(TE)~~ | い(I) |
| Key scan 1 | Cap | ~~ち(CHI)~~ | と(TO) | ~~し(SHI)~~ |
| Key scan 2 | (SHIFT) | つ(TSU) | ~~さ(SA)~~ | ~~そ(SO)~~ |
| Key scan 3 | Ctrl | ✕ | ALT | SPACE |

FIG. 12D

|  | Key sense 0 | Key sense 1 | Key sense 2 | Key sense 3 |
|---|---|---|---|---|
| Key scan 0 | TAB | ~~た(TA)~~ | て(TE) | い(I) |
| Key scan 1 | Cap | ち(CHI) | と(TO) | し(SHI) |
| Key scan 2 | SHIFT | つ(TSU) | ~~さ(SA)~~ | そ(SO) |
| Key scan 3 | (Ctrl) | ✕ | ALT | SPACE |

FIG. 13A

|  | Key sense 0 | Key sense 1 | Key sense 2 | Key sense 3 |
|---|---|---|---|---|
| Key scan 0 | TAB | た(TA) | (て(TE)) | (い(I)) |
| Key scan 1 | Cap | ち(CHI) | と(TO) | し(SHI) |
| Key scan 2 | (SHIFT) | つ(TSU) | さ(SA) | そ(SO) |
| Key scan 3 | Ctrl | ✕ | ALT | SPACE |

FIG. 13B

|  | Key sense 0 | Key sense 1 | Key sense 2 | Key sense 3 |
|---|---|---|---|---|
| Key scan 0 | 0 | 0 | 1 | 1 |
| Key scan 1 | 0 | 0 | 0 | 0 |
| Key scan 2 | 1 | 0 | 0 | 0 |
| Key scan 3 | 0 | 0 | 0 | 0 |

FIG. 13C

|  | Key sense 0 | Key sense 1 | Key sense 2 | Key sense 3 |
|---|---|---|---|---|
| Key scan 0 | 0 | 0 | 0 | 1 |
| Key scan 1 | 0 | 0 | 0 | 0 |
| Key scan 2 | 1 | 0 | 0 | 0 |
| Key scan 3 | 0 | 0 | 0 | 0 |

FIG. 14

|  | Key sense 0 | Key sense 1 | Key sense 2 | Key sense 3 | Key sense 4 | Key sense 5 | Key sense 6 | Key sense 7 |
|---|---|---|---|---|---|---|---|---|
| Key scan 0 | 1 |  |  |  |  |  |  |  |
| Key scan 1 | 2 |  |  |  |  |  |  |  |
| Key scan 2 | 3 |  |  |  |  |  |  |  |
| Key scan 3 | 4 |  |  |  |  |  |  |  |
| Key scan 4 | 5 |  | CTRL |  |  |  |  |  |
| Key scan 5 | 6 |  |  | SHIFT |  |  |  |  |
| Key scan 6 | 7 |  |  |  | ALT |  | ↑ | ↓ |
| Key scan 7 |  | 8 | 9 | 0 |  |  | ← | → |

FIG. 17

Prior Art

| | Key sense 0 | Key sense 1 | Key sense 2 | Key sense 3 | Key sense 4 |
|---|---|---|---|---|---|
| Key scan 0 | WEB | BACK | TALK | OK | ✕ |
| Key scan 1 | ↑ | L | 1 | 2 | 3 |
| Key scan 2 | ← | ✕ | 4 | 5 | 6 |
| Key scan 3 | → | R | 7 | 8 | 9 |
| Key scan 4 | ↓ | SPEAKER | * | 0 | # |

KEY INPUT DEVICE AND MOBILE COMMUNICATION TERMINAL USING THE KEY INPUT DEVICE

TECHNICAL FIELD

The present invention relates to key input devices provided with a plurality of key switches, and in particular to control of operations when three or more key switches are turned on simultaneously.

BACKGROUND ART

Mobile communication terminals such as mobile phones use a key input device having a key matrix structure formed by key scan lines and key sense lines (see, for example, Patent Literature 1).

A typical key matrix structure is described with reference to FIG. 16.

FIG. 16 shows the structure of a key input device 1 provided in a mobile phone.

As shown in FIG. 16, key input device 1 has a key matrix structure formed by five key scan lines (key scan 0-4) and five key sense lines (key sense 0-4). Key switches, which correspond to a plurality of keys (such as numerical keys or arrow keys, TALK key, etc.) of a mobile phone (not shown in the figure) are connected to the key scan lines and the key sense lines.

FIG. 17 shows how keys are assigned in a key matrix circuit.

The key matrix circuit is connected to a key scan circuit 11 having an input port and an output port. The key scan lines are connected to the output port, and the key sense lines are connected to the input port.

A key sense pull-up circuit 12, formed by resistors R0-R4, is connected to the key sense lines, and a high-level signal is constantly output to each of the key sense lines. The key scan circuit 11 detects the switching condition of each key switch by outputting a low-level key scan signal sequentially to each key scan line.

For example, when a key scan signal is output to key scan line 0, if the "TALK" key is pressed, closing the corresponding key switch, then key sense line 2 and key scan line 0 are electrically connected. The change in key sense line 2 to the low level is detected, and the "TALK" key is thus detected as having been pressed.

Patent Literature 2 below lists other prior art literature relating to output control of key input devices.

CITATION LIST

Patent Literature

Patent Literature 1: Japanese Patent Application Publication No. 5-189116
Patent Literature 2: Japanese Examined Patent Application Publication 5-11326

SUMMARY OF INVENTION

Technical Problem

In recent years, mobile phones have been developed to allow users to run applications, such as games, while providing key input via a key input device.

In such mobile phones, arrow keys that indicate the directions of up, down, left, and right, as well as numerical keys composed of number keys and symbol keys (the "*" key and the "#" key) are typically allotted to keys for playing the game.

During game play, users may simultaneously press a complicated combination of keys not envisioned during regular use of telephone functions, such as the "1" key, "2" key, and "4" key among the numerical keys.

A key input device with the above-described conventional key matrix structure, however, may not always support three or more numerical keys being pressed simultaneously in this way.

This problem is described with reference to FIGS. 17 and 18.

In the figures, the up, down, left, and right keys are respectively represented as "↑" "↓" "←", and "→" and hereinafter are referred to as "↑" "↓" "←", and "→" keys. If the "1" key, "2" key, and "4" key are pressed simultaneously, then when the key scan circuit 11 scans key scan line 1, it detects that the "1" key and the "2" key are pressed due to key sense line 2 and key sense line 3 being electrically connected to key scan line 1.

Next, when the key scan circuit 11 scans key scan line 2, it detects that the "4" key is pressed due to key sense line 2 and key scan line 2 being electrically connected. However, at the same time, as shown by the bold line in FIG. 18, key sense line 3 and key scan line 2 are also electrically connected by the key switches for the "1" key, the "2" key, and the "4" key being closed.

As a result, the key scan circuit 11 erroneously detects the "5" key as being pressed, even though it in fact is not. The key scan circuit 11 outputs information indicating that the "1" key, the "2" key, the "4" key, and the "5" key are pressed, and based on this information, processing that the user had not intended is performed. This creates a situation in which the user is unable to properly use the key input device to play the game.

In order to solve the problem of erroneous detection in the key input device, it is possible to provide each key switch with a rectifying circuit (diode) for preventing reverse flow. This is not a favorable solution, however, not only because it would be expensive to provide a plurality of diodes, but also because the key matrix circuit would become larger in proportion to the size of the diodes, creating an obstacle towards making the mobile phone more compact.

It is an object of the present invention to provide a key input device that, without using a rectifying circuit, prevents execution of processing unintended by the user due to erroneous detection of a key the user has not pressed.

Solution to Problem

In order to solve the above problem, a key input device that is an embodiment of the present invention comprises: a key matrix circuit including a plurality of key switches and a matrix of row signal lines and column signal lines, a different one of the key switches being provided at each intersection of a row signal line and a column signal line; a reception unit configured to receive, from the key matrix circuit, first detection information related to electrical connection between each row signal line and each column signal line; a determination unit configured to determine, based on the first detection information, whether a possibility exists that a user has pressed at least three key switches simultaneously and electrical connection between signal lines for a key switch that has not been pressed has been erroneously detected; and an output control unit configured to output information in accordance with one or more key switches pressed by the user based on the first detection information when the determination unit determines that the possibility exists and to block output based on the first detection information when the determination unit determines that the possibility does not exist.

The matrix refers to a grid pattern in which a plurality of signal lines is provided in a first direction, and another plurality of signal lines is provided in a second direction perpendicular to the first direction. The signal lines along the first direction are called row signal lines, and the signal lines along the second, perpendicular direction are called column signal lines. The row signal lines and the column signal lines are, respectively, key scan lines and key sense lines.

The determination by the determination unit corresponds, for example, to step 108 in FIG. 7 or step 205 in FIG. 10.

Note that a row signal line and a column signal line are not electrically connected at an intersection thereof. Rather, a row signal line and a column signal line are connected by a key switch.

Advantageous Effects of Invention

With the above structure, when a possibility exists that a user has pressed at least three key switches simultaneously and electrical connection between signal lines for a key switch that has not been pressed has been erroneously detected, output based on the first detection information is blocked. Therefore, information for a key switch that has not been pressed is not output. Accordingly, execution of processing that the user had not intended due to erroneous detection by the key input device is prevented.

BRIEF DESCRIPTION OF DRAWINGS

FIG. 3 shows how keys of the key input device 300 are assigned.

FIGS. 5A and 5B show detection information when the "1" key, the "2" key, and the "4" key are pressed simultaneously.

FIGS. 12A, 12B, 12C, and 12D show portions of detection information to be masked.

FIGS. 13A, 13B, and 13C schematically show operations when the "SHIFT" key, the "TE" key, and the "I" key are pressed simultaneously.

FIG. 14 shows an example of settings, in a key matrix circuit 330 according to Embodiment 4, of key switches corresponding to special keys and to number keys.

FIG. 17 shows a conventional assignment of keys.

DESCRIPTION OF EMBODIMENTS

Embodiments of the present invention are described below with reference to the drawings.

Embodiment 1

First, a mobile phone 10 is described as an Embodiment of the present invention.

1. Structure of Mobile Phone 10

1.1 Functional Block of Mobile Phone 10

Figure 1:
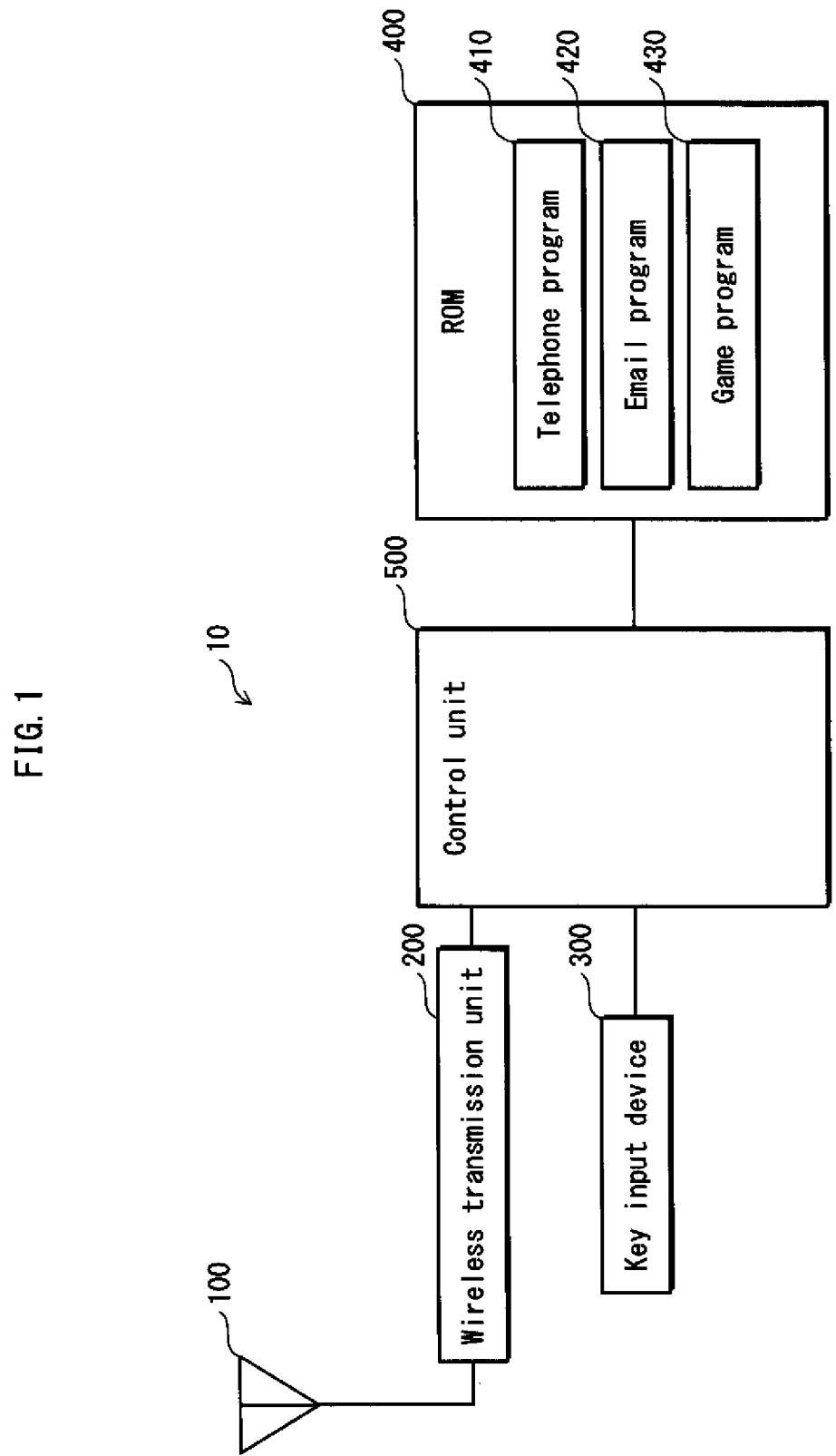
FIG. 1 is a block diagram showing the structure of a mobile phone 10.

FIG. 1 is a block diagram showing the structure of the mobile phone 10.

The mobile phone 10 includes an antenna 100, a wireless transmission unit 200 connected to the antenna 100, a key input device 300, a Read Only Memory (ROM) 400, and a control unit 500.

The wireless transmission unit 200 is a circuit that controls wireless transmission processing, such as demodulation of received signals received through the antenna 100, modulation of transmission signals transmitted through the antenna 100, etc.

The key input device 300 includes a plurality of keys such as arrow keys that indicate different directions, numerical keys, etc. The key input device 300 has the function of accepting user input. Details on the key input device 300 are provided below.

The ROM 400 is a memory storing programs for executing the functions of the mobile phone 10. The main programs recorded in the ROM 400 include a telephone program 410 for placing and receiving phone calls, an email program 420 for sending and receiving electronic mail, a game program 430 for executing a predetermined game, etc.

The control unit 500 is, specifically, a Central Processing Unit (CPU) that achieves the various functions of the mobile phone 10 by executing programs stored in the ROM 400. For example, when a telephone call is to be placed, the control unit 500 performs processing such as executing the telephone program 410, receiving dial input from the key input device 300, and transmitting a signal for dialing the received number and a voice signal to the wireless transmission unit 200.

When an email is to be sent, the control unit 500 performs processing such as executing the email program 420, receiving input of an email address from the key input device 300, and transmitting character data to the wireless transmission unit 200.

When a game is to be played, the control unit 500 performs processing such as executing the game program 430, rendering graphics for characters and the like in the game, receiving input of the arrow keys and numerical keys from the key input device 300, and performing graphics processing for movement of characters based on the received input.

Note that the mobile phone 10 is typically provided with other devices such as a display unit for screen display, a microphone for audio input, a speaker for audio output, etc. As these devices are unrelated to the present Embodiment, however, a description thereof is omitted. The structure of these devices may be the same as in a conventional mobile phone.

1.2 Structure of Key Input Device 300
1.2.1 Hardware Structure of Key Input Device 300

Next, the structure of the key input device 300 is described in detail.

Figure 2:
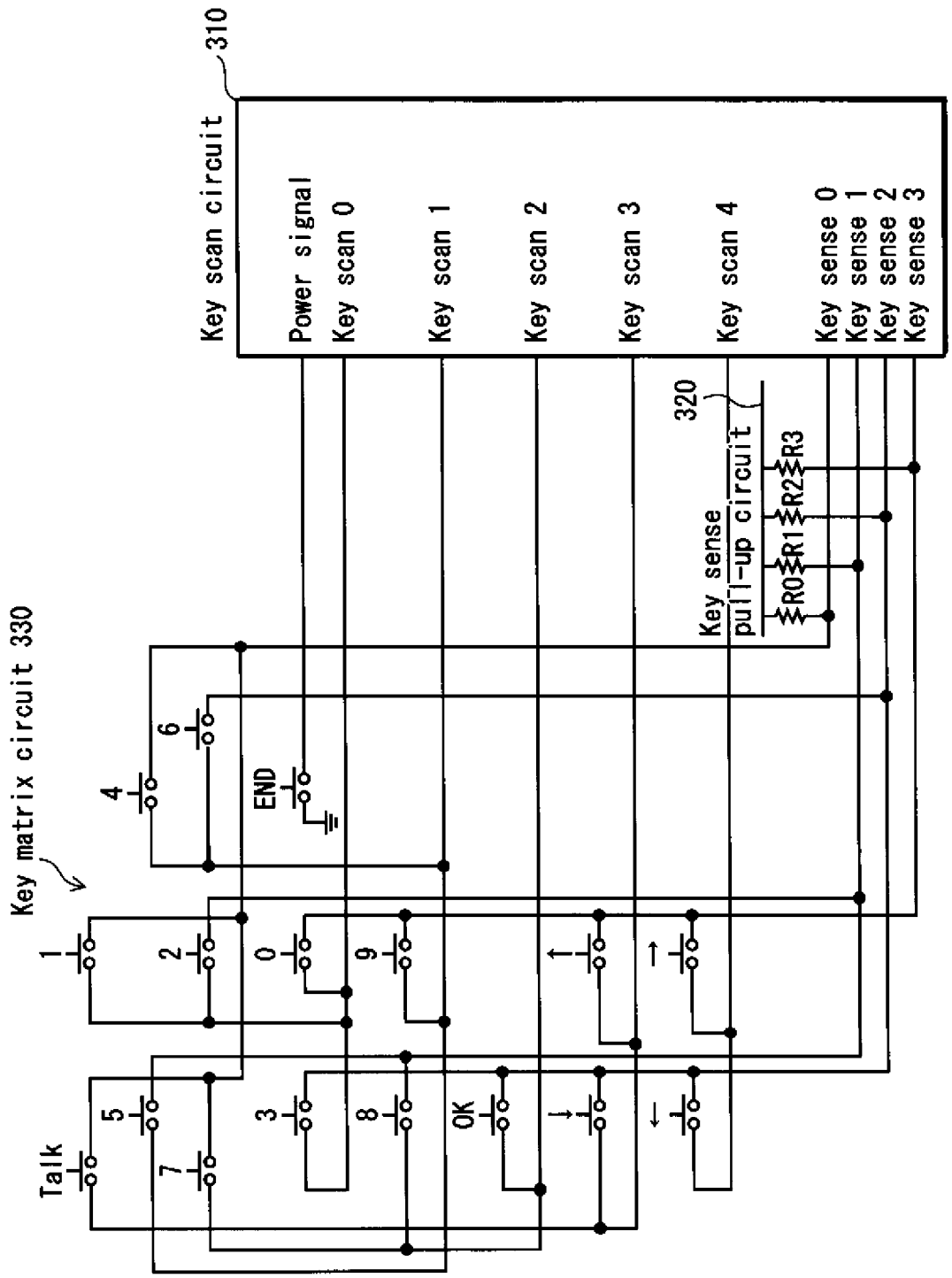
FIG. 2 is a block diagram showing the structure of a key input device 300.

FIG. 2 is a block diagram showing the structure of the key input device 300.

The key input device 300 has a key scan circuit 310, key sense pull-up circuit 320, and a key matrix circuit 330.

The key matrix circuit 330 has a key matrix structure formed by five key scan lines (key scan 0-4) and four key sense lines (key sense 0-3). Key switches corresponding to a plurality of keys in the key input device 300 are connected to the key scan lines and the key sense lines.

Note that the key scan lines and the key sense lines in the present Embodiment correspond to the row signal lines and column signal lines of the present invention.

FIG. 3 shows how keys are assigned in the key input device 300. The crossed out portions in FIG. 3 indicate that the intersection of key scan line 2 with key sense line 3, the intersection of key scan line 3 with key sense line 1, and the intersection of key scan line 4 with key sense lines 0 and 1 are not assigned to a key switch.

In FIGS. 2 and 3, the up, down, left, and right keys are respectively represented as "↑" "↓" "←", and hereinafter in this description are referred to as "↑" "↓" "←", and "→" keys. The up, down, left, and right ("↑", "↓", "←", "→") keys are referred to collectively as arrow keys, and the number keys ("0"-"9") are referred to collectively as numerical keys.

As shown in FIGS. 2 and 3, the key switch for the "1" key is connected to key scan line 0 and key sense line 0 in the key matrix circuit 330.

The key switch for the "2" key is connected to key scan line 0 and key sense line 1.

The key switch for the "3" key is connected to key scan line 0 and key sense line 2.

The key switch for the "0" key is connected to key scan line 0 and key sense line 3.

The key switch for the "4" key is connected to key scan line 1 and key sense line 0.

The key switch for the "5" key is connected to key scan line 1 and key sense line 1.

The key switch for the "6" key is connected to key scan line 1 and key sense line 2.

The key switch for the "9" key is connected to key scan line 1 and key sense line 3.

The key switch for the "7" key is connected to key scan line 2 and key sense line 0.

The key switch for the "8" key is connected to key scan line 2 and key sense line 1.

The key switch for the "OK" key is connected to key scan line 2 and key sense line 2.

The key switch for the "Talk" key is connected to key scan line 3 and key sense line 0.

The key switch for the "↓" key is connected to key scan line 3 and key sense line 2.

The key switch for the "↑" key is connected to key scan line 3 and key sense line 3.

The key switch for the "←" key is connected to key scan line 4 and key sense line 2.

The key switch for the "→" key is connected to key scan line 4 and key sense line 3.

The key scan lines are connected to an output port of the key scan circuit 310, and the key sense lines are connected to an input port thereof.

The key sense pull-up circuit 320 is formed by resistors R0-R4 and is connected to the key sense lines. A high-level signal is constantly output to each of the key sense lines.

The following describes how the key scan circuit 310 detects when a key (key switch) is pressed.

The key scan circuit 310 outputs a low-level key scan signal sequentially to each key scan line by time sharing.

If one of the keys is pressed, the contacts of the key switch corresponding to the pressed key close, the key scan line and key sense line connected to the key switch are electrically connected via the key switch, and the voltage of the key sense line becomes low level.

The key scan circuit 310 detects the change in voltage of the key sense line, thus detecting the switching condition of the key switch.

For example, if the key scan circuit 310 scans key scan line 1 while the "9" key is pressed, only the voltage of key sense line 3 is low level, while the voltage of the remaining key sense lines (key sense lines 0-2) is high level. Based on this change in voltage level, the key scan circuit 310 detects that the "9" key is pressed.

1.2.2 Functional Structure of Key Scan Circuit 310

Figure 4:
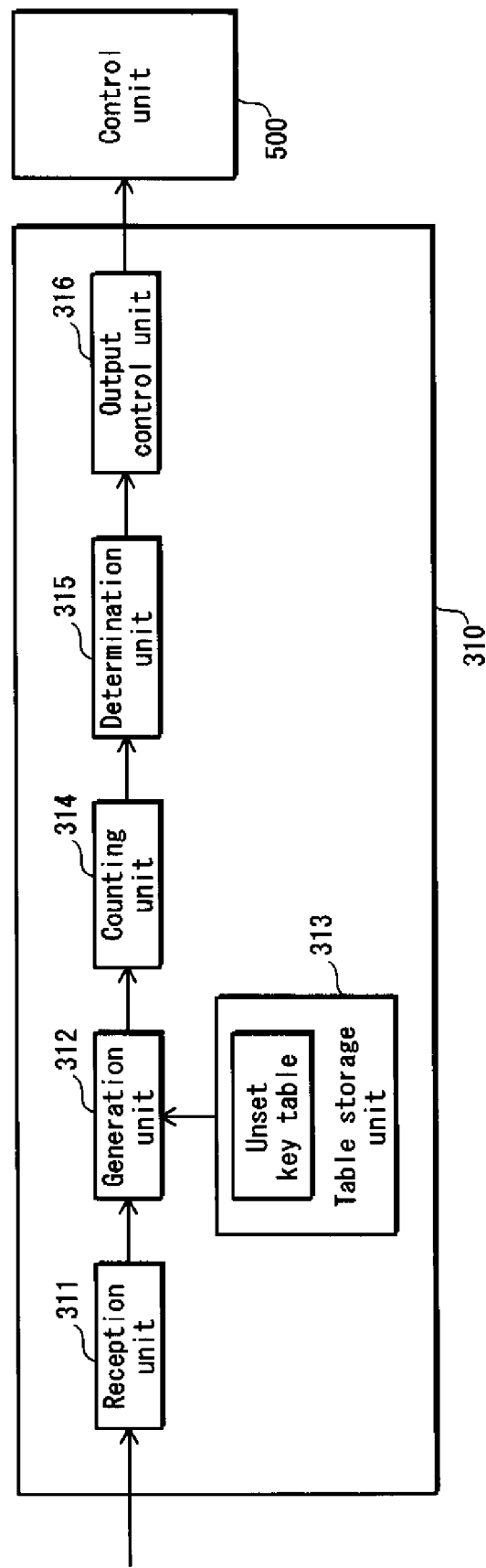
FIG. 4 is a functional block diagram showing the structure of a key scan circuit 310 according to Embodiment 1.

Next, the functions of the key scan circuit 310 are described. FIG. 4 is a functional block diagram showing the structure of the key scan circuit 310. As shown in FIG. 4, the key scan circuit 310 includes a reception unit 311, a generation unit 312, a table storage unit 313, a counting unit 314, a determination unit 315, and an output control unit 316. Specifically, the units 311-316 are implemented by being described by computer programs.

The following describes the functions of the key scan circuit 310 in detail.

The reception unit 311 receives detection information (first detection information) from the key matrix circuit 330 related to electrical connection between the key scan lines and key sense lines and transmits the received detection information to the generation unit 312.

The following describes the detection information. FIGS. 5A and 5B show an example of detection information when the "1" key, the "2" key, and the "4" key are pressed simultaneously.

Like FIG. 3, FIG. 5A shows how keys are assigned in the key input device 300. The numbers in FIG. 5A that are circled indicate the keys that are pressed simultaneously. In other words, FIG. 5A shows that the "1" key, the "2" key, and the "4" key are pressed simultaneously.

FIG. 5B shows detection information related to electrical connection between the key scan lines and key sense lines. A "1" in FIG. 5B indicates a key for which the key scan circuit 310 has detected a change in voltage level (i.e. received an input signal). In other words, a "1" indicates a key for which the key scan line and the key sense line are electrically connected. A value other than "1", i.e. a "0", indicates that the key scan line and the key sense line are not electrically connected.

As shown in FIG. 5B, since the "1" key, the "2" key, and the "4" key are pressed simultaneously, the portions corresponding to the "1" key, the "2" key, and the "4" key in the detection information have a value of "1". Furthermore, when the "1" key, the "2" key, and the "4" key are pressed simultaneously, key sense line 1 and key scan line 1 end up being electrically connected due to the key switches for the "1" key, the "2" key, and the "4" key being closed. As a result, the key scan circuit 310 ends up detecting a change in voltage level for the "5" key as well, thus erroneously detecting that the "5" key is pressed. The value of the portion corresponding to the "5" key is therefore "1".

Returning to FIG. 4, the generation unit 312 refers to an unset key table stored in the table storage unit 313 and, based on the detection information input from the reception unit 311, masks a portion of the detection information to generate another piece of detection information (second detection information). Masking the detection information refers to rewriting information indicating that a key scan line and a key sense line are electrically connected to indicate instead that the lines are not connected. In the example in FIG. 5B, this refers to rewriting a value of "1" to "0". When detection information received from the reception unit 311 includes, among the information indicating electrical connection between key scan lines and key sense lines, information corresponding to a key in the unset key table, the generation unit 312 generates second detection information by rewriting the information corresponding to the key in the unset key table so as to indicate no electrical connection. The generation unit 312 transmits the detection information thus generated to the counting unit 314.

The table storage unit 313 stores an unset key table indicating keys for which no key switch is provided at the intersection of a key scan line and a key sense line.

The counting unit 314 counts the number of key sense lines in electrical connection with each key scan line in the detection information input from the generation unit 312 and also counts the number of key scan lines in electrical connection with each key sense line in the detection information. Furthermore, the counting unit 314 counts the number of key scan lines in electrical connection with two or more key sense lines and the number of key sense lines in electrical connection with two or more key scan lines, transmitting the counts to the determination unit 315.

The determination unit 315 determines, based on the counts input from the counting unit 314, whether or not both (i) the number of key scan lines in electrical connection with two or more key sense lines is two or greater and (ii) the number of key sense lines in electrical connection with two or more key scan lines is two or greater, transmitting the determination results to the output control unit 316.

Based on the determination results input from the determination unit 315, the output control unit 316 controls output to the control unit 500.

2. Operations of Key Scan Circuit 310

Figure 6A:
FIGS. 6A, 6B, and 6C schematically show operations of the key scan circuit 310.
Figure 6B:
Figure 6C:
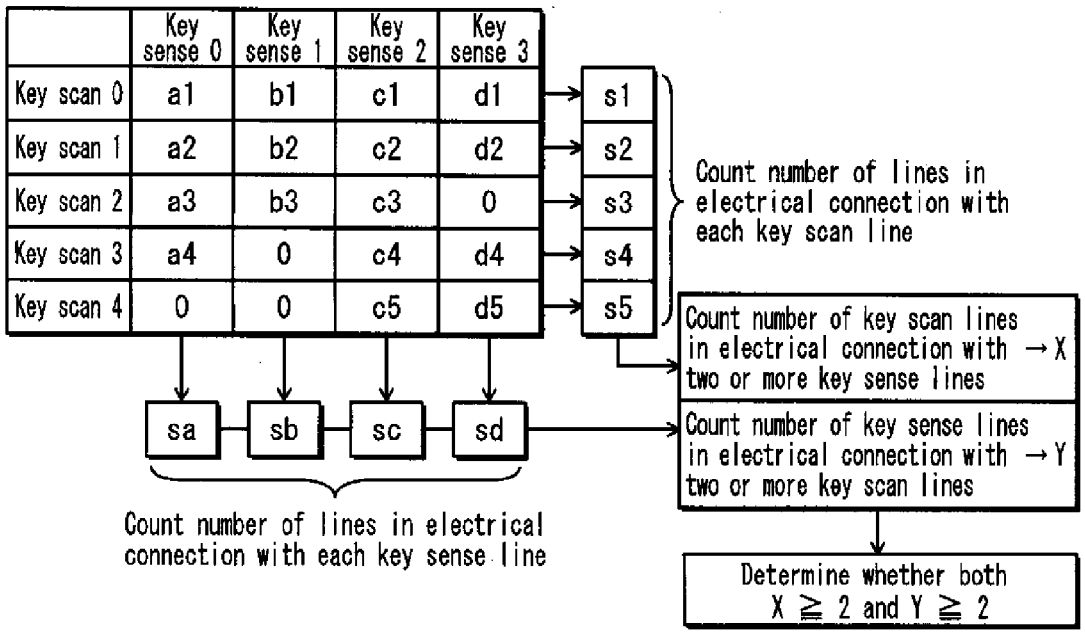

Next, the operations of the key scan circuit 310 are described. FIGS. 6A, 6B, and 6C schematically show operations of the key scan circuit 310.

Like FIG. 3, FIG. 6A shows an example of assignment of keys. Upon receiving detection information from the key matrix circuit 330, in which keys are assigned as shown in FIG. 6A, the key scan circuit 310 generates detection information in which unset keys are masked, as shown in FIG. 6B. Then, as shown in FIG. 6C, the key scan circuit 310 counts the number of key sense lines in electrical connection with each key scan line. For example, for key scan line 0, the key scan circuit 310 counts the sum (s1) of a1, b1, c1, and d1. The same count is also performed for the other key scan lines.

The key scan circuit 310 also counts the number of key scan lines in electrical connection with each key sense line. For example, for key sense line 0, the key scan circuit 310 counts the sum (sa) of a1, a2, a3, and a4. The same count is also performed for the other key sense lines. In the figures, the reference signs a1-a4, b1-b3, c1-c5, and d1-d5 indicate an input signal of the corresponding key; s1-s5 indicate the sum of the input signals for the respective key scan line; and sa-sd indicate the sum of input signals for the respective key sense line.

Furthermore, the key scan circuit 310 counts the number (X) of key scan lines in electrical connection with two or more key sense lines and the number (Y) of key sense lines in electrical connection with two or more key scan lines, controlling output based on the value of X and Y.

Figure 7:
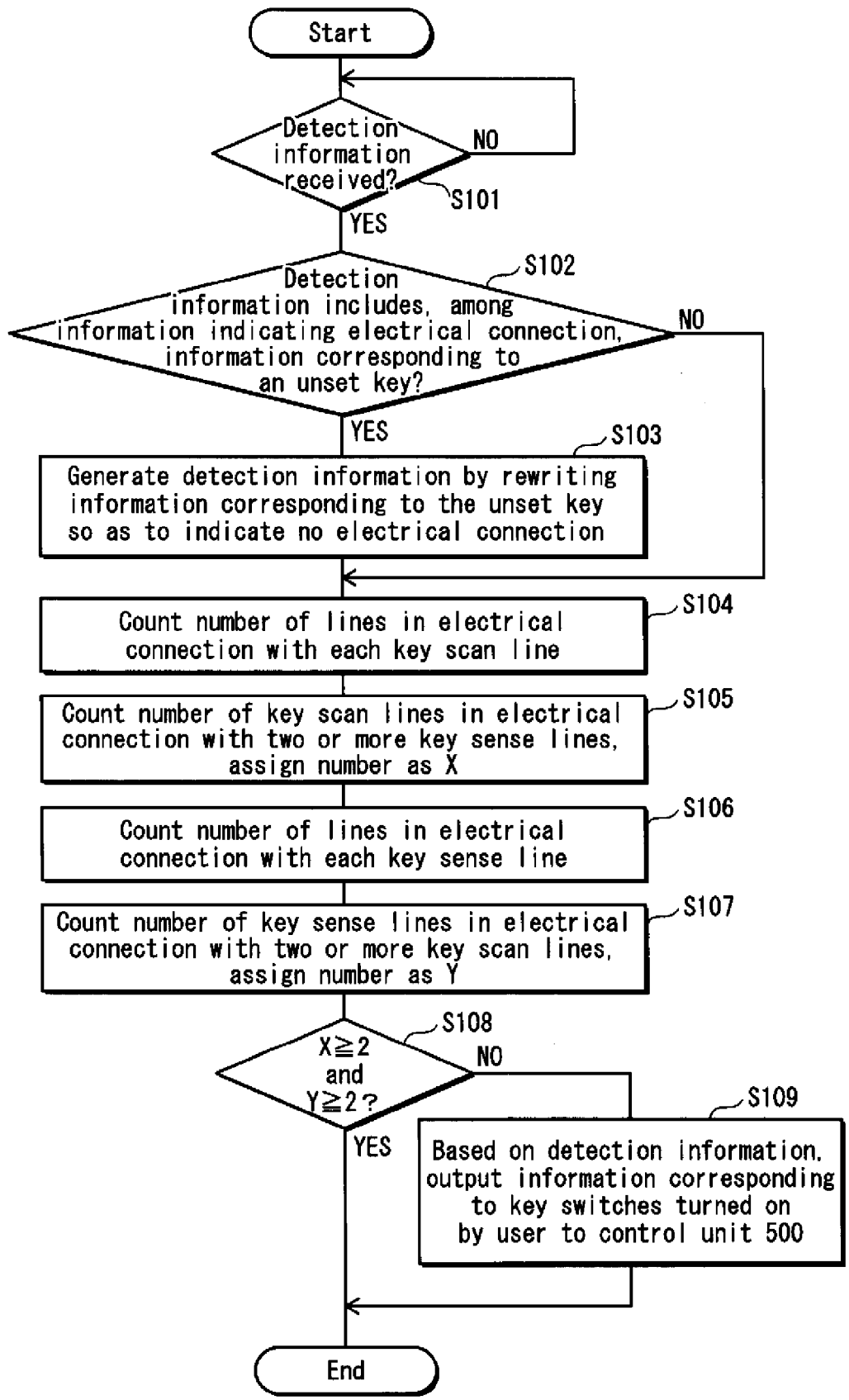
FIG. 7 is a flowchart showing an example of operations by the key scan circuit 310.

The following is a detailed description of an example of operations by the key scan circuit 310 with reference to a flowchart. FIG. 7 is a flowchart showing an example of operations by the key scan circuit 310.

First, upon receiving detection information from the key matrix circuit 330 (step S101: YES), the key scan circuit 310 determines whether the received detection information includes, among the information indicating electrical connection, information corresponding to an unset key (step S102).

When the detection information includes, among the information indicating electrical connection, information corresponding to an unset key (step S102: YES), the information corresponding to the unset key is rewritten so as to indicate no electrical connection, thereby generating another piece of detection information (step S103).

When the detection information does not include, among the information indicating electrical connection, information corresponding to an unset key (step S102: NO), step S103 is skipped, and processing from step S104 on is performed.

Next, the number of key sense lines in electrical connection with each key scan line in the detection information is counted (step S104). The number of key scan lines in electrical connection with two or more key sense lines is then counted and assigned as X (step S105).

Subsequently, the number of key scan lines in electrical connection with each key sense line in the detection information is counted (step S106). The number of key sense lines in electrical connection with two or more key scan lines is then counted and assigned as Y (step S107).

It is then determined whether both X is two or greater and Y is two or greater (step S108). The reason for this determination is as follows. When three keys are pressed simultaneously, in addition to detection of the three keys that are pressed, a key that is not pressed is erroneously detected in the following case: among the three keys, two keys are on the same key scan line, and one of these two keys is on the same key sense line as the remaining key. In this case, X is two or greater, and Y is two or greater. If four keys forming a rectangle are pressed simultaneously, although no key is erroneously detected, the same detection information is received as when the above three keys are pressed. In other words, it is impossible to distinguish between when three keys are pressed and one key is erroneously detected, and when four keys are actually pressed.

Therefore, when both X and Y are each two or greater, i.e. when the possibility exists of erroneous detection of pressing of a key switch (step S108: YES), output based on the detection information is blocked to prevent execution, due to erroneous detection of a key, of processing that the user had not intended.

If at least one of X and Y is under two (step S108: NO), information corresponding to the keys turned on by the user is output to the control unit 500 based on the detection information. At this point, if the received detection information includes, among the information indicating electrical connection, information corresponding to an unset key, output is based on masked detection information.

3. Specific Example of Operations by Mobile Phone 10

3.1 When Output is Blocked Based on Detection Information

Figures 8A, 8B, 8C:
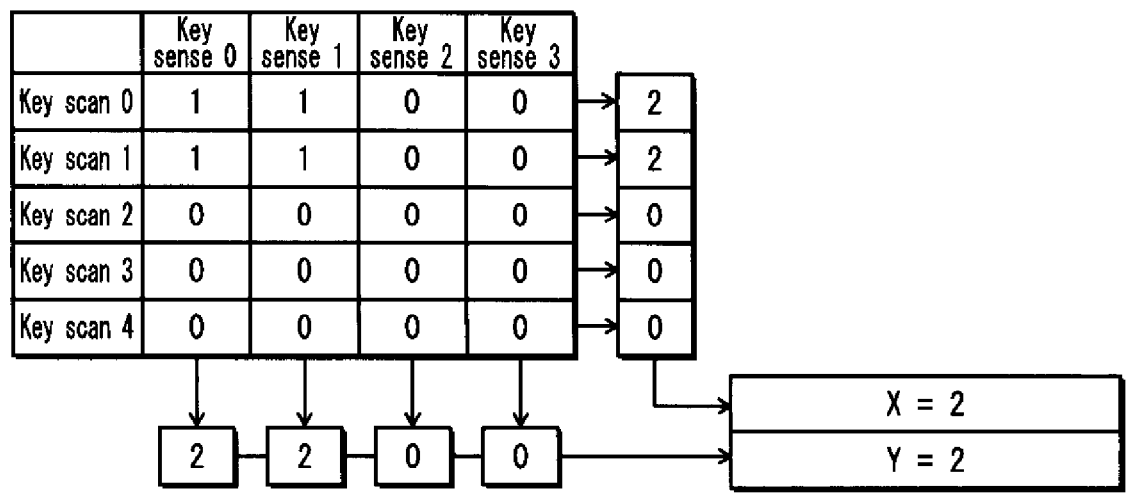
FIGS. 8A, 8B, and 8C schematically show operations when output based on detection information is blocked.

The following describes a specific example of when output is blocked based on detection information. FIGS. 8A, 8B, and 8C schematically show operations when the "1" key, the "2" key, and the "4" key are pressed simultaneously.

Like FIG. 5A, FIG. 8A indicates that the "1" key, the "2" key, and the "4" key are pressed simultaneously.

Like FIG. 5B, FIG. 8B indicates that, in the detection information, in addition to the portions corresponding to the "1" key, the "2" key, and the "4" key, the portion corresponding to the "5" key also has a value of "1" due to erroneous detection.

When the "1" key, the "2" key, and the "4" key are pressed simultaneously, the number of key sense lines in electrical connection with key scan line 0 is two, as shown in FIG. 8C. The number of key sense lines in electrical connection with key scan line 1 is also two. The number of key sense lines in electrical connection with key scan lines 2, 3, and 4 is zero per key scan line.

The number of key scan lines in electrical connection with key sense line 0 is two. The number of key scan lines in electrical connection with key sense line 1 is also two. The number of key scan lines in electrical connection with key sense lines 2 and 3 is zero per key sense line.

Therefore, since the number of key scan lines in electrical connection with two or more key sense lines is two, and the number of key sense lines in electrical connection with two or more key scan lines is two, output based on the detection information is blocked.

3.2 When Information Corresponding to Keys Turned on by the User is Output

The following describes a specific example of when information corresponding to keys turned on by the user is output. FIGS. 9A, 9B, 9C, and 9D schematically show operations when the "1" key, the "2" key, the "6" key, and the "Talk" key are pressed simultaneously.

Figures 9A, 9B, 9C, 9D:
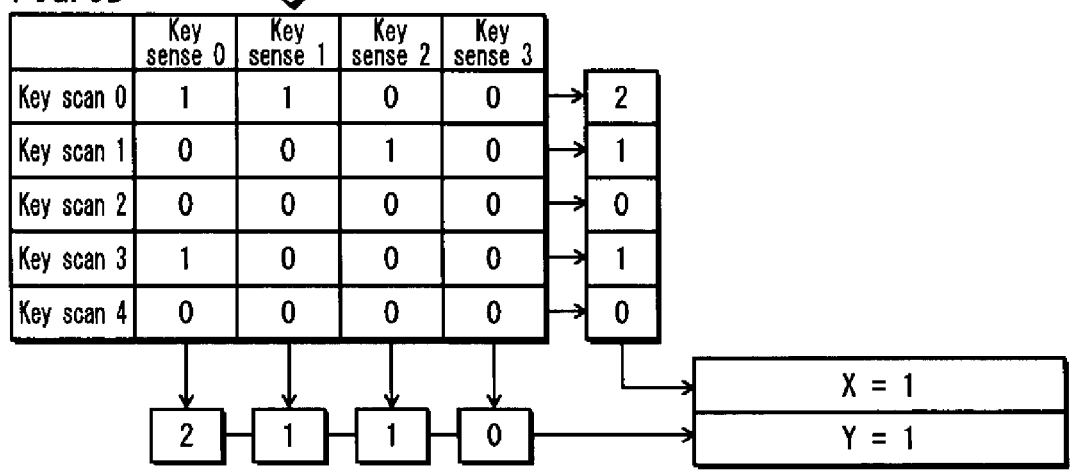
FIGS. 9A, 9B, 9C, and 9D schematically show operations when information indicating keys turned on by the user is output.

FIG. 9A indicates that the "1" key, the "2" key, the "6" key, and the "Talk" key are pressed simultaneously.

FIG. 9B indicates that, in the detection information, in addition to the portions corresponding to the "1" key, the "2" key, the "6" key, and the "Talk" key, a portion corresponding to a key for which no key switch is provided (indicated by the dotted circle in the figures) also has a value of "1" due to erroneous detection.

When the "1" key, the "2" key, the "6" key, and the "Talk" key are pressed simultaneously, then as shown in FIG. 9C, the portion with a dotted circle is masked based on the unset key table, and another piece of detection information is generated by rewriting the value of this portion to "0".

As a result, as shown in FIG. 9D, the number of key sense lines in electrical connection with key scan line 0 is two, the number of key sense lines in electrical connection with key scan lines 1 and 3 is one per key scan line, and the number of key sense lines in electrical connection with key scan lines 2 and 4 is zero per key scan line.

The number of key scan lines in electrical connection with key sense line 0 is two, the number of key scan lines in electrical connection with key sense lines 1 and 2 is one per key sense line, and the number of key scan lines in electrical connection with key sense line 3 is zero.

Therefore, since the number of key scan lines in electrical connection with two or more key sense lines is one, and the number of key sense lines in electrical connection with two or more key scan lines is one, the condition of the number of key scan lines in electrical connection with two or more key sense lines being two or greater and the number of key sense lines in electrical connection with two or more key scan lines being two or greater is not fulfilled. Therefore, output based on the detection information is not blocked, and information corresponding to the keys pressed by the user, i.e. the "1" key, the "2" key, the "6" key, and the "Talk" key is output to the control unit 500.

When both the number of key scan lines in electrical connection with two or more key sense lines is two or greater and the number of key sense lines in electrical connection with two or more key scan lines is two or greater, although a key is not always erroneously detected, the possibility of erroneous detection exists. Therefore, with the structure of the above Embodiment, output based on the detection information is blocked in this case, thus preventing output of information corresponding to key switches that are not pressed. Accordingly, execution of processing that the user had not intended due to erroneous detection by the key input device 300 is prevented.

Additionally, when the detection information includes, among the information indicating electrical connection between key scan lines and key sense lines, information corresponding to a key in the unset key table, detection information is generated to mask such information, and output control is performed based on the generated detection information. This increases the frequency with which three pressed keys are correctly detected.

Furthermore, by not including an additional circuit, the key input device 300 is equivalent to a conventional key input device in terms of hardware, thus contributing to making mobile phones more compact.

Embodiment 2

In the present Embodiment, when three keys are pressed simultaneously, prevention of processing based on erroneous detection of a key that has not been pressed is guaranteed via more simple control.

In the key scan circuit 310 in the present Embodiment, the counting unit 314, determination unit 315, and output control unit 316 perform the following processing that differs from Embodiment 1.

The counting unit 314 counts the number of key scan lines and key sense lines in electrical communication in the detection information input from the generation unit 312, transmitting the count to the determination unit 315.

The determination unit 315 determines whether the number of key scan lines and key sense lines in electrical connection as input from the counting unit 314 is four or greater, transmitting the determination results to the output control unit 316.

Based on the determination results input from the determination unit 315, the output control unit 316 controls output to the control unit 500.

Other functions are the same as in Embodiment 1.

Figure 10:
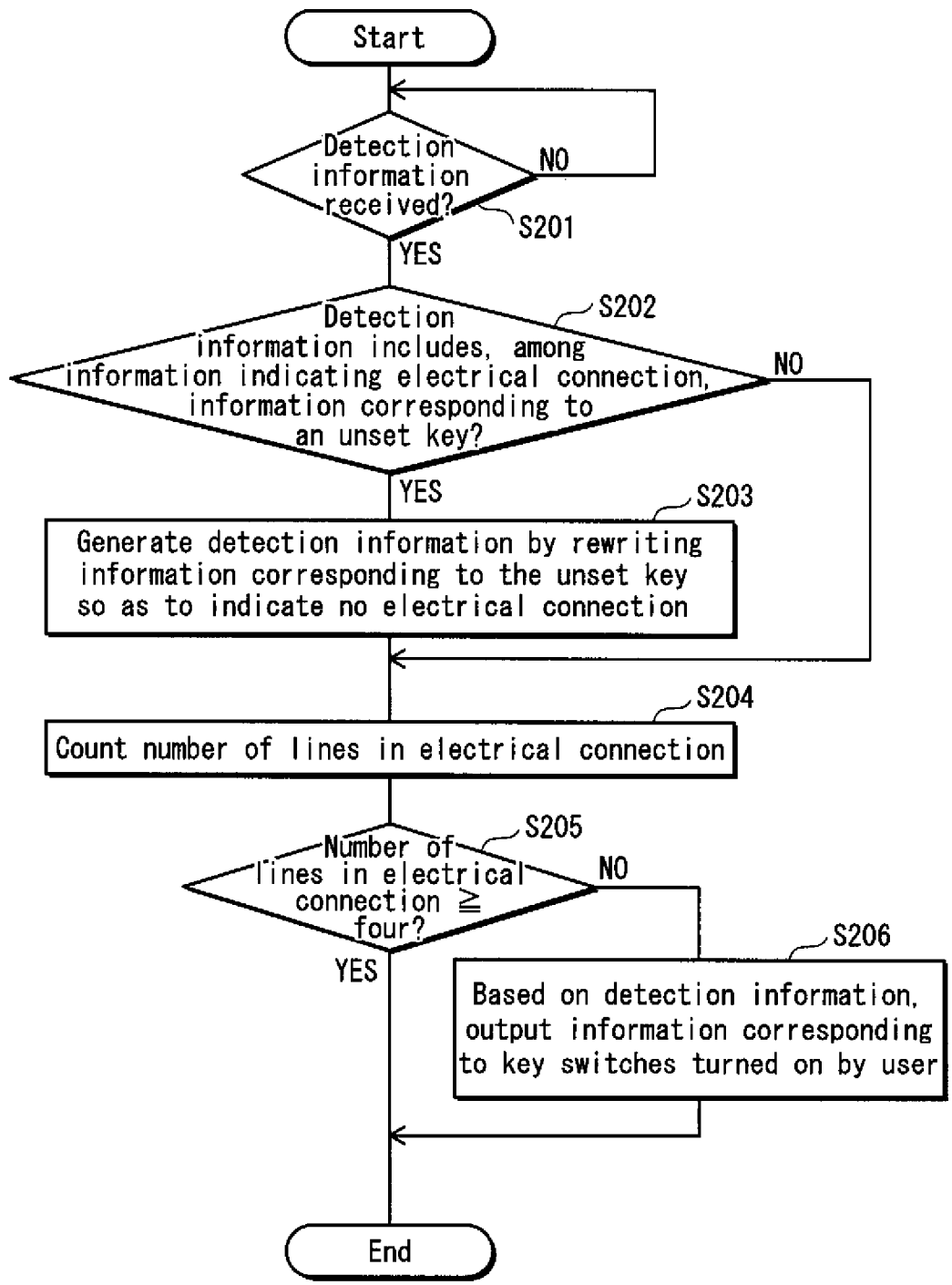
FIG. 10 is a flowchart showing an example of operations by a key scan circuit 310 according to Embodiment 2.

The following is a detailed description of an example of operations of the key scan circuit 310 in the present Embodiment with reference to a flowchart. FIG. 10 is a flowchart showing an example of operations by the key scan circuit 310 in the present Embodiment.

Steps S201-S203 in FIG. 10 are the same as steps S101-S103 in FIG. 7, and therefore a description thereof is omitted. In step S204, the key scan circuit 330 counts the number of key scan lines and key sense lines in electrical connection in the detection information (or in the masked detection information if the received detection information includes, among the information indicating electrical connection, information corresponding to an unset key).

It is then determined whether the number of lines in electrical connection is four or greater (step S205). This is because if the number is four or greater, the possibility of erroneous detection exists.

Accordingly, when the number of lines in electrical connection is four or greater (step S205: YES), output based on the received detection information is blocked.

When the number of lines in electrical connection is less than four (step S205: NO), information corresponding to key switches turned on by the user is output based on the detection information (step S206). At this point, if the received detection information includes, among the information indicating electrical connection, information corresponding to an unset key, output is based on masked detection information, as in Embodiment 1.

With the structure of the above Embodiment, the number of lines in electrical connection in the detection information is counted, and output control is based on whether the number is four or greater. When three keys are pressed simultaneously, this structure simplifies control for guaranteeing prevention of processing based on erroneous detection of a key that has not been pressed.

Embodiment 3

In Embodiment 1, if the received first detection information includes, among the information indicating electrical connection, information corresponding to an unset key, second detection information is generated by rewriting the information corresponding to the unset key so as to indicate no electrical connection. In the present Embodiment, on the other hand, if the second detection information includes, among the information indicating electrical connection, information corresponding to a special key, detection information (third detection information) is generated by rewriting the information corresponding to the special key so as to indicate no electrical connection, thereby masking keys corresponding to special keys. In this context, a special key refers to a control key (hereinafter, "Ctrl" key), alt key (hereinafter, "ALT" key), shift key (hereinafter, "SHIFT" key), etc.

Figure 11:
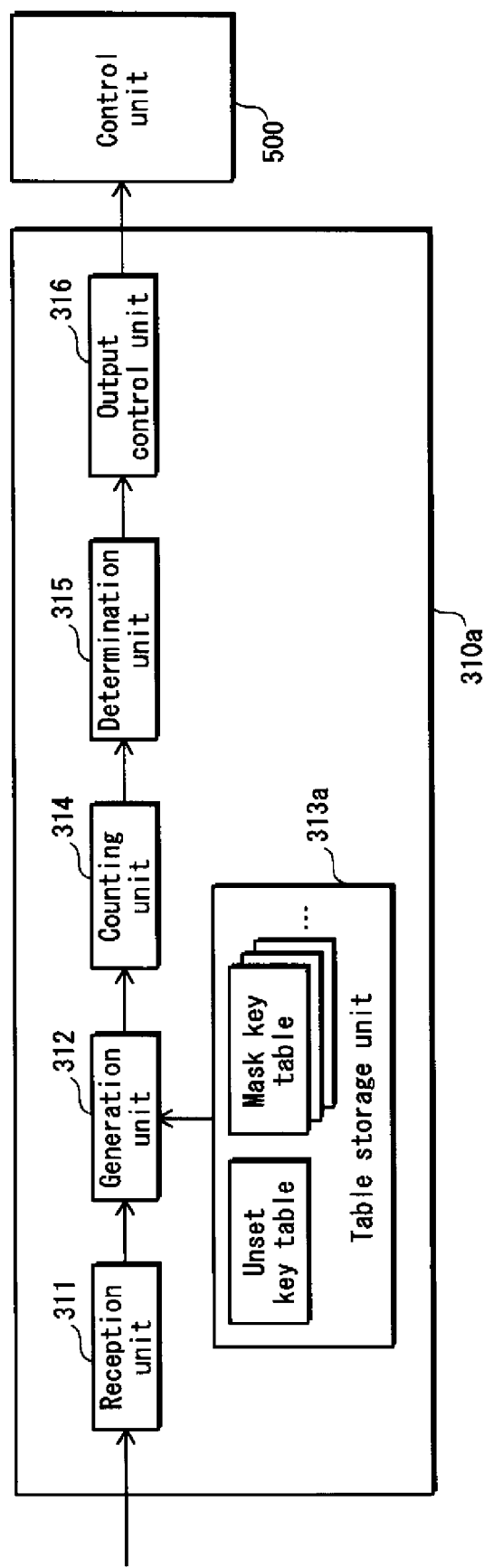
FIG. 11 is a functional block diagram showing a structure of a key scan circuit 310a according to Embodiment 3.

FIG. 11 is a functional block diagram showing a structure of a key scan circuit 310a according to the present Embodiment. As shown in FIG. 11, in addition to the unset key table, the table storage unit 313a stores a mask key table for each special key. Each mask key table associates a special key with one or more keys that are to be masked when an input signal corresponding to the special key is detected. Keys that are to be masked are, for example, keys that are not envisioned to be simultaneously pressed with the associated special key.

The generation unit 312a refers to an unset key table stored in the table storage unit 313a and, based on the detection information input from the reception unit 311, masks a portion of the detection information to generate another piece of detection information (second detection information).

Furthermore, when the generated detection information includes, among the information indicating electrical connection between key scan lines and key sense lines, information corresponding to a special key in one of the mask key tables, then if the detection information includes, among the information indicating electrical connection between key scan lines and key sense lines, information corresponding to one or more keys that are to be masked in association with the special key, the generation unit 312a generates another piece of detection information (third detection information) by rewriting the information corresponding to the keys to be masked so as to indicate no electrical connection.

The generation unit 312a transmits the detection information thus generated to the counting unit 314.

Other functions are the same as in Embodiment 1.

Next, the present Embodiment is described in detail using the example of inputting Japanese kana (one-syllable Japanese characters) on a keyboard of the key input device 300 according to the present Embodiment. FIGS. 12A, 12B, 12C, and 12D show portions of detection information to be masked. FIG. 12A shows a portion of a keyboard. FIG. 12B corresponds to FIG. 12A and shows how each key in the keyboard is assigned. Portions corresponding to keys for which no key switch is provided are indicated as being masked in the detection information (crossed out portions), as described in Embodiment 1.

FIG. 12C corresponds to FIG. 12A and shows how each key in the keyboard is assigned. Portions of FIG. 12C are crossed out to indicate keys to be masked when the detection information includes, among the information indicating electrical connection between key scan lines and key sense lines, information corresponding to the "SHIFT" key. As shown in FIG. 12C, when the "SHIFT" key is pressed, simultaneous pressing is accepted for the Japanese "TSU" and "I" keys (the same keys as the English letters Z and E, respectively), but not for the "TA", "TE", etc. keys (the same keys as the letters Q and W, respectively). This is because when the "SHIFT" key is pressed along with the "TSU" key or the "I" key, the control unit 500 processes input of a small "TSU" or small "I". However, when the "SHIFT" key is pressed along with the "TA" key, no processing for input is performed (since no equivalent to a small "TA" exists among Japanese kana).

FIG. 12D corresponds to FIG. 12A and shows how each key in the keyboard is assigned. Portions of FIG. 12D are crossed out to indicate keys to be masked when the detection information includes, among the information indicating electrical connection between key scan lines and key sense lines, information corresponding to the "Ctrl" key.

The keys to be masked for each special character are associated in this way.

Next, as an example of generating detection information in which keys associated with a special key are masked, a case is described in which a plurality of keys including the "SHIFT" key are pressed. FIGS. 13A, 13B, and 13C schematically show operations when the "SHIFT" key, the "TE" key, and the "I" key are pressed simultaneously. FIG. 13A shows how keys are assigned in the key input device 300 according to the present Embodiment. The numbers in FIG. 13A that are circled indicate the keys that are pressed simultaneously. In other words, FIG. 13A shows that the "SHIFT" key, the "TE" key, and the "I" key are pressed simultaneously.

As shown in FIG. 13B, since the "SHIFT" key, the "TE" key, and the "I" key are pressed simultaneously, the value of the portions of the detection information corresponding to the "SHIFT" key, the "TE" key, and the "I" key is "1". When the detection information includes, among the information indicating electrical connection between key scan lines and key sense lines, information corresponding to the "SHIFT" key, detection information is generated to mask the portions that are crossed out in FIG. 12B. Accordingly, as shown in FIG. 13C, detection information is generated to mask the portion corresponding to the "TE" key.

With the structure of the above Embodiment, when for example pressing a plurality of keys including the "SHIFT" key, if the "TE" key, which is not envisioned as being pressed simultaneously with the "SHIFT" key, is erroneously pressed or erroneously detected as being pressed, detection information is generated to mask the portion corresponding to the "TE" key, and output control is performed based on the generated information. This improves usability.

Embodiment 4

The present Embodiment relates to improving the setting position, in the key matrix circuit, of key switches corresponding to special keys and to number keys.

When, for example, using applications such as games or the like, it is possible that three or more number keys will be pressed simultaneously. Therefore, in the present Embodiment, the key switches corresponding to the number keys are positioned in the key matrix circuit 330 so that no combination of three simultaneously pressed number keys will cause erroneous detection.

Specifically, when three keys are pressed simultaneously, erroneous detection occurs when two of the three keys are located on the same key scan line (key sense line), and the remaining key is located on the same key sense line (key scan line) as either of the two keys.

Therefore, the key switches corresponding to the number keys are positioned to avoid any arrangement of three key switches satisfying conditions of (i) two of the key switches being located on different key scan lines and on different key sense lines, and (ii) the remaining key switch being located on the same key scan line as one of the two key switches and the same key sense line as the other of the two key switches.

Key switches corresponding to special keys for which simultaneous pressing is envisioned are similarly positioned, i.e. the key switches corresponding to the "CTRL" key, the "ALT" key, and the "SHIFT" key are positioned to avoid any arrangement satisfying conditions of (i) two of the key switches being on different key scan lines and on different key sense lines, and (ii) the remaining key switch being located on the same key scan line as one of the two key switches and the same key sense line as the other of the two key switches.

FIG. 14 shows an example of settings, in the key matrix circuit 330 according to the present Embodiment, of key switches corresponding to special keys and to number keys.

As shown in FIG. 14, the key switch for the "1" key is connected to key scan line 0 and key sense line 0 in the key matrix circuit 330.

The key switch for the "2" key is connected to key scan line 1 and key sense line 0.

The key switch for the "3" key is connected to key scan line 2 and key sense line 0.

The key switch for the "4" key is connected to key scan line 3 and key sense line 0.

The key switch for the "5" key is connected to key scan line 4 and key sense line 0.

The key switch for the "6" key is connected to key scan line 5 and key sense line 0.

The key switch for the "7" key is connected to key scan line 6 and key sense line 0.

The key switch for the "8" key is connected to key scan line 7 and key sense line 1.

The key switch for the "9" key is connected to key scan line 7 and key sense line 2.

The key switch for the "0" key is connected to key scan line 7 and key sense line 3.

The key switch for the "CTRL" key is connected to key scan line 4 and key sense line 2.

The key switch for the "SHIFT" key is connected to key scan line 5 and key sense line 3.

The key switch for the "ALT" key is connected to key scan line 6 and key sense line 4.

The key switch for the "↓" key is connected to key scan line 6 and key sense line 7.

The key switch for the "↑" key is connected to key scan line 6 and key sense line 6.

The key switch for the "←" key is connected to key scan line 7 and key sense line 6.

The key switch for the "→" key is connected to key scan line 7 and key sense line 7.

Any key may be assigned to the blank portions. Only keys that are not envisioned to be pressed simultaneously with either special keys or with number keys can be assigned to the hatched portions, but it is preferable not to assign any key to the hatched portions.

The structure of the above Embodiment prevents erroneous detection when three number keys are pressed simultaneously. The above structure also prevents erroneous detection when three keys including one or more special keys are pressed simultaneously.

Embodiment 5

The present Embodiment relates to improving the setting position of two key switches that are covered by the same key cap.

Typically, in a keyboard exemplifying a key input device, key switches are covered by key caps indicating numerical keys, arrow keys, alphabetic keys, etc. Each key switch is positioned at a location corresponding to the center of the key cap. In such a keyboard, pressing of a key may not be detected. For example, the "SPACE" key has a longer key cap than other keys, so that when an edge of the key cap is pressed, the contacts of the key switch may not close, resulting in the key press not being detected.

To address this problem, the present Embodiment provides two key switches for the "SPACE" key. As a result, pressing of the key is detected even when an edge of the key cap is pressed. The setting position of two key switches for the "SPACE" key is described with reference to FIGS. 15A, 15B, and 15C.

Figure 15:
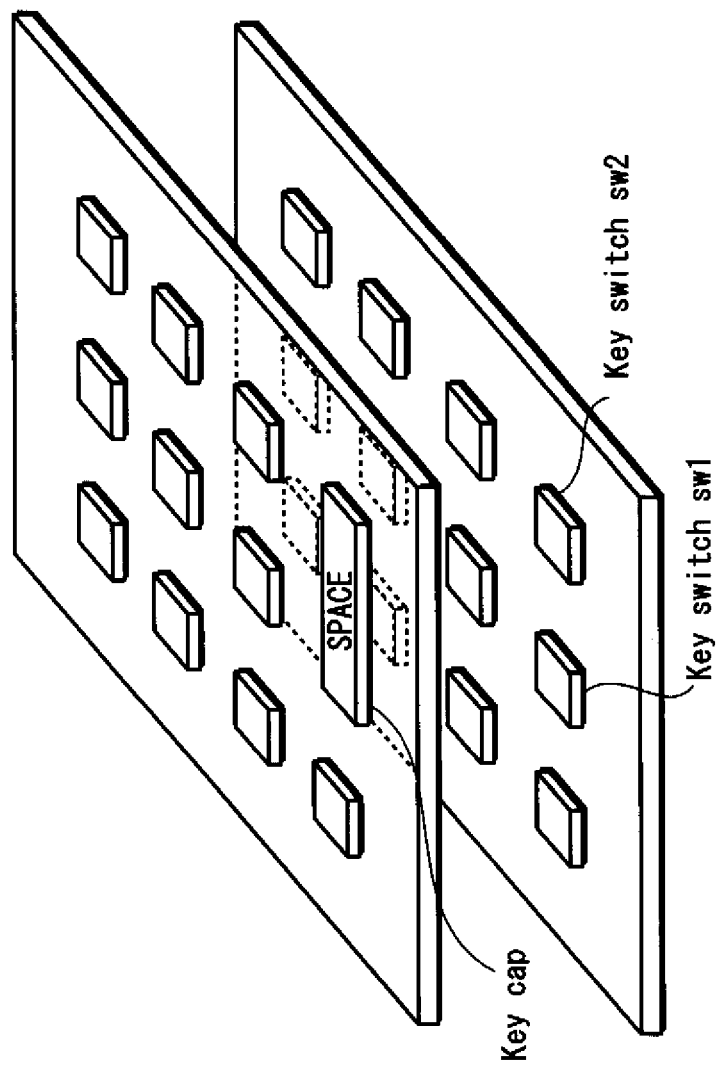
FIGS. 15A, 15B, and 15C show the relationship between key caps and key switches, as well as the setting position of two key switches corresponding to the "SPACE" key.
Figure 16:
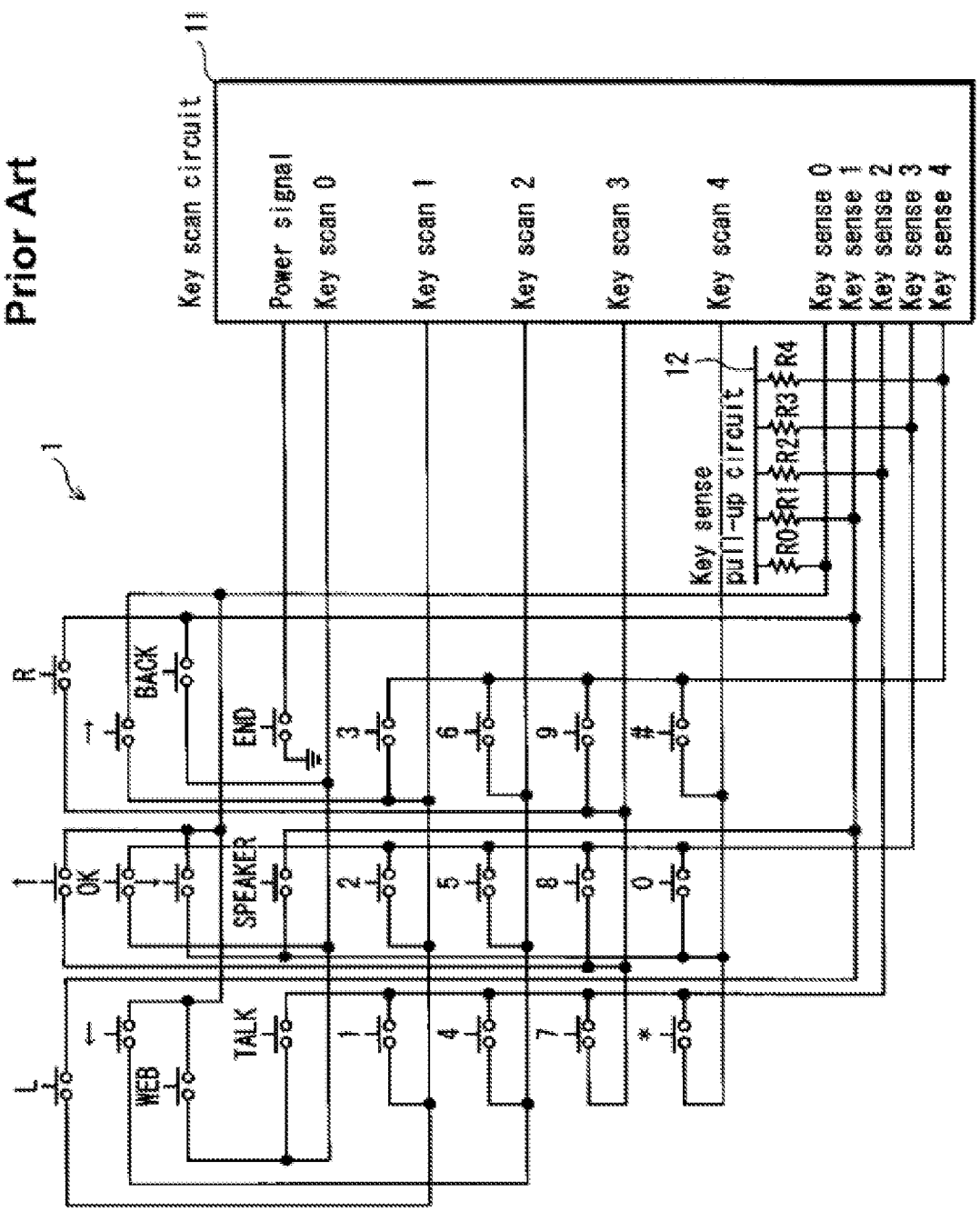
FIG. 16 shows a conventional key input device.
Figure 18:
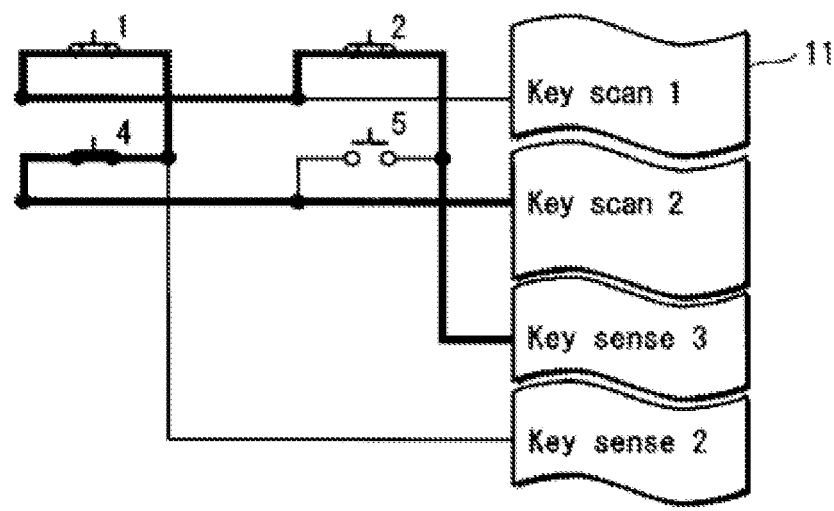
FIG. 18 is a conceptual diagram showing a current path in a conventional key matrix circuit.

FIGS. 15A, 15B, and 15C show the relationship between key caps and key switches, as well as the setting position of two key switches corresponding to the "SPACE" key.

As shown in FIG. 15A, two key switches (key switch sw1 and key switch sw2) are provided for the key cap indicating the "SPACE" key.

FIG. 15B shows an example of when the key switch sw1 and the key switch sw2 are not assigned to the same key scan line or to the same key sense line in the key matrix circuit 330 according to the present Embodiment. Specifically, the key switch sw1 is connected to key scan line 3 and key sense line 1. The key switch sw2 is connected to key scan line 2 and key sense line 2. The hatched portions indicate portions in which a key that is to be pressed simultaneously with the "SPACE" key cannot be placed. This is because if a key corresponding to one of the hatched portions is pressed simultaneously with the "SPACE" key, the key scan circuit 310 according to the present Embodiment will accept an input signal for corresponding to "SPACE1" and "SPACE2" in addition to the input signal for the key corresponding to one of the hatched portions, thereby leading to an erroneous detection.

FIG. 15C shows an example of when the key switch sw1 and the key switch sw2 are assigned to the same key scan line (key scan line 3) in the key matrix circuit 330 according to the present Embodiment. The hatched portions indicate portions in which a key that is to be pressed simultaneously with the "SPACE" key cannot be placed.

As is clear by comparing FIG. 15B with FIG. 15C, there are fewer hatched portions in FIG. 15B.

Therefore, when two key switches are provided for the "SPACE" key, the key switches are positioned as in FIG. 15B. This eases the restrictions on the placement of key switches corresponding to keys pressed simultaneously with the "SPACE" key, yielding effective placement of key switches in the key matrix circuit 330 according to the present Embodiment.

<Supplementary Explanation>

A key input device according to the present invention has been described based on the above Embodiments, but the present invention is of course not limited to the above Embodiments.

(1) In the above Embodiments, row signal lines and column signal lines of the present invention respectively correspond to key scan lines and key sense lines, but the present invention is not limited in this way.

This description simply illustrates how rows and columns intersect. Alternatively, column signal lines may be key sense lines, and row signal lines may be key scan lines.

(2) In the above Embodiments, the unset key table indicates keys for which no key switch is provided at an intersection of a key scan line and a key sense line. Alternatively, the unset key table may indicate keys for which a key switch is provided but which are not assigned as operation keys.

(3) In the above Embodiments, a mobile phone is described as an example of a mobile communication terminal provided with a key input device according to the present invention, but the present invention is not limited in this way.

For example, the key input device of the present invention may be provided in devices such as a Personal Digital Assistant (PDA) or a laptop Personal Computer (PC).

(4) In the above Embodiments, detection information related to electrical connection between the key scan lines and the key sense lines is first detection information, for example as shown in FIG. 5B. Alternatively, each piece of detection information related to electrical connection between a key scan line and a key sense line (for example, detection information related to electrical connection between key scan line 0 and key sense line 0) may be a piece of first detection information, and each piece of first detection information corresponding to an unset key may be masked.

(5) In Embodiment 1, in step S102 of FIG. 7, it is determined whether the received detection information includes, among the information indicating electrical connection, information corresponding to an unset key. Alternatively, without performing this sort of determination, detection information may be generated by rewriting, based on the received detection information, information corresponding to an unset key so as to indicate no electrical connection.

(6) In Embodiment 2, the key input device 300 counts the number of lines in electrical connection in the detection information and performs output control based on whether the number is four or greater. However, if two key switches covered by the same key cap exist in the key input device 300, as shown in Embodiment 5, then when three keys including the key corresponding to the two key switches are pressed simultaneously, the key scan circuit 310 in Embodiment 2 may end up detecting four input signals. As a result, the number of lines in electrical connection becomes four, and output based on the detection information ends up being blocked.

To address this problem, the table storage unit 313 in the key scan circuit 310 of Embodiment 2 may further store a table indicating the two key switches covered by the same key cap. When the detection information includes, among the information indicating electrical connection between key scan lines and key sense lines, information corresponding to the two key switches, the counting unit 314 of Embodiment 2 may then count the electrical connections of the two key switches as only one connection.

With this structure, accurate output control is performed even when three keys including the key corresponding to the two key switches are pressed simultaneously.

Alternatively, the table storage unit 313 in Embodiment 2 may store a predetermined detection information pattern, and this pattern may be information indicating that two key switches covered by the same key cap are electrically connected. Accurate output control may then be performed by the counting unit 314 of Embodiment 2 comparing the input detection information with the stored detection information pattern and, when the two match, invalidating one piece of information that indicates electrical connection upon counting the pieces of information indicating electrical connection.

(7) In Embodiment 3, the generation unit 312a generates second detection information and further generates third detection information. Alternatively, based on the first detection information, the generation unit 312a may generate detection information (fourth detection information) masking portions corresponding to keys indicated in the unset key table and portions corresponding to keys that are to be masked in association with special keys.

(8) In Embodiment 3, the table storage unit 313a stores mask key tables, but alternatively, information indicating keys to be masked may be received from an application in order to automatically rewrite mask key tables.

(9) In Embodiment 3, special keys are the "Ctrl" key, the "ALT" key, and the "SHIFT" key, but the present invention is not limited in this way. Any key that is envisioned as being pressed simultaneously with other keys may be a special key.

(10) In Embodiment 3, keyboard input of Japanese kana was described as an example of the key input device, but input is not limited to kana, nor to Japanese characters.

(11) In Embodiment 5, the key scan circuit 310 may include a test mode and an application mode as operation modes.

Before shipment of the mobile phone, such a key scan circuit 310 operates in test mode, in which input signals from the two key switches corresponding to the "SPACE" key are handled separately.

By separately handling signals corresponding to the key switches, proper operation of the key switches can be confirmed.

Furthermore, after shipment, when the user uses the mobile phone, the modified key scan circuit 310 in Embodiment 5 operates in application mode, and when an input signal is received for either of the two key switches corresponding to the "SPACE" key, the "SPACE" key is treated as having been pressed.

The above Embodiments and modifications in the Supplementary Explanation may be combined with each other.

INDUSTRIAL APPLICABILITY

The present invention is widely applicable to key input devices having a key matrix structure.

REFERENCE SIGNS LIST 10 mobile phone
100 antenna
200 wireless transmission unit
300 key input device
310 key scan circuit
311 reception unit
312 generation unit
313 table storage unit
314 counting unit
315 determination unit
316 output control unit
320 key sense pull-up circuit
330 key matrix circuit
400 ROM
500 control unit

The invention claimed is:
1. A key input device comprising:

a key matrix circuit including a plurality of key switches and a matrix of row signal lines and column signal lines, a different one of the key switches being provided at each intersection of a row signal line and a column signal line;

a reception unit configured to receive, from the key matrix circuit, first detection information related to electrical connection between each row signal line and each column signal line;

a determination unit configured to determine, based on the first detection information, whether a possibility exists that a user has pressed at least three key switches simultaneously and electrical connection between signal lines for an additional key switch that has not been pressed has been erroneously detected; and an output control unit configured to output information in accordance with one or more key switches pressed by the user based on the first detection information when the determination unit determines that the possibility does not exist and to block output of information based on the first detection information when the determination unit determines that the possibility exists, wherein outputting the information by the output control unit permits execution of processing based on the one or more pressed key switches, and blocking output of the information by the output control unit prevents execution of processing based on the one or more pressed key switches in combination with the erroneously detected key switch press.

2. The key input device of claim 1, wherein
the determination unit determines whether the possibility exists by determining whether both a plurality of row signal lines in electrical connection with at least two column signal lines and a plurality of column signal lines in electrical connection with at least two row signal lines exist,
the determination unit determines that the possibility does not exist when determining that at least one of the number of row signal lines in electrical connection with at least two column signal lines and the number of column signal lines in electrical connection with at least two row signal lines is less than two, and
the determination unit determines that the possibility exists when determining that both the number of row signal lines in electrical connection with at least two column signal lines and the number of column signal lines in electrical connection with at least two row signal lines are at least two.

3. The key input device of claim 2, wherein
the key matrix circuit includes an intersection of a row signal line and a column signal line not provided with a key switch,
the key input device further comprises:
a storage unit configured to store unset key switch information indicating the intersection not provided with a key switch; and
a generation unit configured to generate second detection information when the first detection information includes, among information indicating electrical connection between row signal lines and column signal lines, information corresponding to the unset key switch information, by rewriting the information corresponding to the unset key switch information so as to indicate no electrical connection, and
the determination unit determines whether the possibility exists based on the second detection information generated from the first detection information.

4. The key input device of claim 3, wherein
the storage unit is further configured to store a correspondence between a first key switch and a second key switch among the plurality of key switches,
the generation unit is further configured to generate third detection information when the second detection information includes, among information indicating electrical connection between row signal lines and column signal lines, information corresponding to the first key switch and information corresponding to the second key switch, by rewriting the information corresponding to the second key switch so as to indicate no electrical connection, and
the determination unit determines whether the possibility exists based on the third detection information generated from the second detection information.

5. The key input device of claim 2, further comprising:
a group of keys in one-to-one correspondence with the plurality of key switches, wherein
the group of keys includes a control key, an alt key, and a shift key, and
key switches corresponding to the control key, alt key, and shift key are positioned to avoid any arrangement satisfying conditions of (i) any two key switches being on different row signal lines and on different column signal lines, and (ii) the remaining key switch being located on the same row signal line as one of the any two key switches and the same column signal line as another of the any two key switches.

6. The key input device of claim 2, further comprising:
a group of keys in one-to-one correspondence with the plurality of key switches, wherein
the group of keys includes number keys from 0 through 9, and
key switches corresponding to the number keys are positioned to avoid any arrangement of three key switches satisfying conditions of (i) two key switches among the three key switches being on different row signal lines and on different column signal lines, and (ii) the remaining key switch being located on the same row signal line as one of the two key switches and the same column signal line as another of the two key switches.

7. The key input device of claim 2, wherein
each of the plurality of key switches is covered by a key cap, and
two of the key switches are covered by the same key cap, the two key switches being provided on different row signal lines and different column signal lines.

8. The key input device of claim 1, wherein
the key matrix circuit includes an intersection of a row signal line and a column signal line not provided with a key switch,
the key input device further comprises:
a storage unit configured to store unset key switch information indicating the intersection not provided with a key switch; and
a generation unit configured to generate second detection information when the first detection information includes, among information indicating electrical connection between row signal lines and column signal lines, information corresponding to the unset key switch information, by rewriting the information corresponding to the unset key switch information so as to indicate no electrical connection,
the determination unit determines whether the possibility exists by determining, based on one of the first detection information and the second detection information generated from the first detection information, whether or not the number of row signal lines and column signal lines in electrical communication is at least four, the determination unit determines that the possibility does not exist when determining that the number of row signal lines and column signal lines in electrical communication is less than four, and the determination unit determines that the possibility exists when determining that the number of row signal lines and column signal lines in electrical communication is at least four.

9. The key input device of claim 8, wherein each of the plurality of key switches is covered by a key cap, two of the key switches are covered by the same key cap, the storage unit is further configured to store information indicating the two key switches, and when the determination unit determines that the number of row signal lines and column signal lines in electrical communication is at least four, and when the second detection information includes, among information indicating electrical connection between row signal lines and column signal lines, information corresponding to the information stored in the storage unit indicating the two key switches, the determination unit counts electrical communication only once for the two key switches.

10. The key input device of claim 9, wherein the two key switches are provided on different row signal lines and different column signal lines.

11. A mobile communication terminal provided with the key input device of claim 1, wherein key switches of the key input device are covered by key caps indicating numerical keys and arrow keys.

* * * * *